(12) United States Patent
Noda et al.

(10) Patent No.: US 6,558,867 B2
(45) Date of Patent: May 6, 2003

(54) LIFT-OFF RESIST COMPOSITIONS

(75) Inventors: Kazumi Noda, Usui-gun (JP); Tomoyoshi Furihata, Usui-gun (JP); Hideto Kato, Usui-gun (JP)

(73) Assignee: Shin Etsu Chemical Co., Ltd., Tokyo (JP)

( * ) Notice: Subject to any disclaimer, the term of this patent is extended or adjusted under 35 U.S.C. 154(b) by 20 days.

(21) Appl. No.: 09/789,837

(22) Filed: Feb. 22, 2001

(65) Prior Publication Data

US 2001/0019808 A1 Sep. 6, 2001

(30) Foreign Application Priority Data

Feb. 23, 2000 (JP) ........................................ 2000-045446

(51) Int. Cl.$^7$ ................................................ G03F 7/023
(52) U.S. Cl. ........................ 430/191; 430/192; 430/193
(58) Field of Search ................................. 430/191, 192, 430/193

(56) References Cited

U.S. PATENT DOCUMENTS

| | | | | |
|---|---|---|---|---|
| 5,128,230 A | * | 7/1992 | Templeton et al. | 430/165 |
| 5,318,875 A | * | 6/1994 | Kawabe et al. | 430/165 |
| 5,340,686 A | * | 8/1994 | Sakaguchi et al. | 430/165 |
| 6,210,855 B1 | * | 4/2001 | Ueda et al. | 430/190 |

* cited by examiner

Primary Examiner—John S. Chu
(74) Attorney, Agent, or Firm—Millen, White, Zelano & Branigan, P.C.

(57) ABSTRACT

A single layer lift-off resist composition comprising a novolac resin, a quinonediazidosulfonate photosensitive agent, and an aromatic hydroxy compound having at least one phenolic hydroxyl group in which the phenolic hydroxyl group is partially acylated is improved in adhesion to a substrate.

19 Claims, No Drawings

LIFT-OFF RESIST COMPOSITIONS

This invention relates to single layer lift-off resist compositions which are improved in adhesion to substrates over prior art single layer lift-off resist compositions.

BACKGROUND OF THE INVENTION

In prior art photoresist compositions for the single layer lift-off process, the effect of aromatic hydroxy compounds added as a dissolution accelerator enables to form a pattern shape having undercuts where the pattern contacts the substrate.

Because of the characteristic pattern shape, the prior art single layer lift-off photoresist composition has a reduced area of contact with the substrate. It is thus susceptible to pattern peel as compared with ordinary photoresist compositions. This becomes a substantial bar against the target of patterning to a smaller feature size.

SUMMARY OF THE INVENTION

An object of the invention is to provide a single layer lift-off resist composition which is improved in adhesion to a substrate and effective in preventing pattern peel.

The invention is directed at a positive-acting resist composition for use in the single layer lift-off process comprising a novolac resin and a quinonediazidosulfonate photosensitive agent. It has been found that when an aromatic hydroxy compound having at least one phenolic hydroxyl group in which the phenolic hydroxyl group is partially acylated, represented by the general formula (1) shown below, is used therein as a dissolution accelerator, the resist composition becomes more hydrophobic, forms a resist film firmly bondable to a substrate, and prevents from peeling.

Accordingly, the invention provides a single layer lift-off resist composition comprising a novolac resin, a quinonediazidosulfonate photosensitive agent, and an aromatic hydroxy compound having at least one phenolic hydroxyl group in which the phenolic hydroxyl group is partially acylated, represented by the following general formula (1).

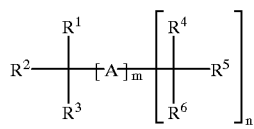

(1)

Herein m is an integer of 0 to 2, n is an integer of 0 to 2, with the proviso that m is 1 or 2 when n is 0. $R^1$ to $R^6$ are independently hydrogen, methyl, a group of the following formula (2), or a group of the following formula (3). When n is 0 and m is 1, A is hydrogen, methyl or a group of the following formula (2). When n is 0 and m is 2, one of A is methylene or a group of the following formula (4), and the other of A is hydrogen, methyl or a group of the following formula (2). When n is 1, A is methylene or a group of the following formula (4). When n is 2 and m is 1, A is methine or a group of the following formula (5). When n is 2 and m is 2, one of A is methylene or a group of the following formula (4), and the other of A is methine or a group of the following formula (5). At least one of $R^1$ to $R^6$ and A has a structure of a benzene ring having a hydroxyl group added thereto.

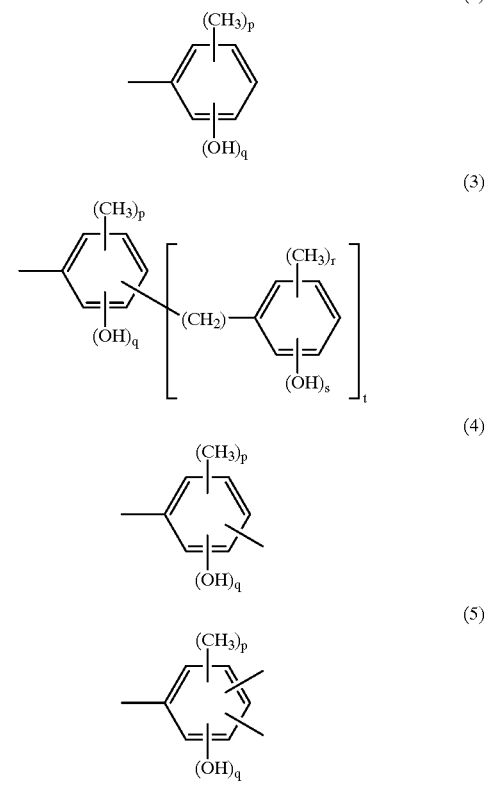

Herein p, q, r and s are integers of 0 to 3, and t is an integer of 1 to 3.

DESCRIPTION OF THE PREFERRED EMBODIMENT

The positive-acting photoresist composition for use in the single layer lift-off process according to the invention contains a novolac resin as a resin component, a quinonediazidosulfonate ester as a photosensitive agent, and an aromatic hydroxy compound in which the phenolic hydroxyl group is partially acylated as a dissolution accelerator, all dissolved in an organic solvent.

The resin component used herein is selected from novolac resins which are customarily used in the photoresist art, for example, and preferably novolac resins prepared by effecting condensation reaction of phenol, o-, m- or p-cresol, xylenol or a mixture of such phenolic compounds with a formaldehyde. The resin component should preferably have a weight average molecular weight (Mw) in the range of about 2,000 to 20,000, more preferably about 5,000 to 15,000. Note that the weight average molecular weight is determined on the basis of polystyrene by gel permeation chromatography (GPC). Too low Mw tends to exaggerate film slimming after development whereas too high Mw tends to lower a development rate.

The photosensitive component used herein is selected from well-known quinonediazidosulfonic esters, for example, naphthoquinonediazidosulfonic esters of 2,3,4-trihydroxybenzophenone, naphthoquinonediazidosulfonic esters of 2,3,4,4'-tetrahydroxybenzophenone, and naphthoquinone-diazidosulfonic esters of 2,2',4,4'-tetrahydroxy-benzophenone, which are commercially available. Those photosensitive components in which at least 65 mol % of phenolic hydroxyl groups are esterified with naphthoquinonediazidosulfonic acid are preferred for lift-off pattern formation. In the practice of the invention, preferably about 25 to 45 parts, more preferably about 30 to 40 parts by weight of the photosensitive component is blended per 100 parts by weight of the resin component or novolac resin. Too small amounts of the photosensitive component tend to lower resolution and film retentivity whereas too large amounts tend to lower sensitivity.

The dissolution accelerator used herein is an aromatic hydroxy compound having at least one phenolic hydroxyl group in which the phenolic hydroxyl group is partially acylated, represented by the following general formula (1).

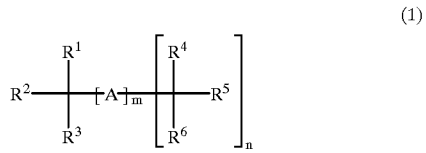
(1)

Herein m is an integer of 0 to 2, n is an integer of 0 to 2, with the proviso that m is 1 or 2 when n is 0. $R^1$ to $R^6$ are independently hydrogen, methyl, a group of the following formula (2), or a group of the following formula (3). In the event of n=0 and m=1, A is hydrogen, methyl or a group of the following formula (2). In the event of n=0 and m=2, one of A is methylene or a group of the following formula (4), and the other of A is hydrogen, methyl or a group of the following formula (2). In the event of n=1, A is methylene or a group of the following formula (4). In the event of n=2 and m=1, A is methine or a group of the following formula (5). In the event of n=2 and m=2, one of A is methylene or a group of the following formula (4), and the other of A is methine or a group of the following formula (5).

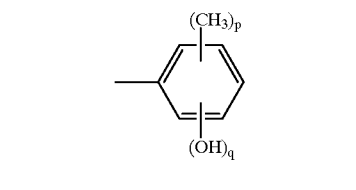
(2)

(3)

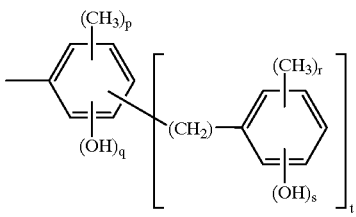
(4)

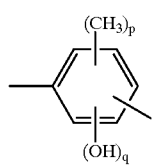

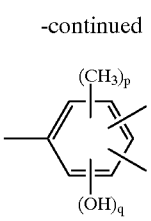
(5)

Herein p, q, r and s are integers of 0 to 3, and t is an integer of 1 to 3.

The aromatic hydroxy compound of formula (1) has at least one phenolic hydroxyl group. Accordingly, at least one of $R^1$ to $R^6$ and A has a structure of a benzene ring having a hydroxyl group added thereto. The letters m, n, p, q, r, s and t are selected such that the compound of formula (1) may have at least one phenolic hydroxyl group.

In the compound of formula (1), the number of benzene rings contained is preferably 2 to 20, and more preferably 3 to 10, and the ratio of the number of phenolic hydroxyl groups to the number of benzene rings is preferably from 0.5 to 2.5, and more preferably from 0.7 to 2.0. If the ratio of the number of phenolic hydroxyl groups to the number of benzene rings is less than 0.5, the rate of dissolution in an alkaline developer may become low and the formation of a lift-off pattern become difficult. If the same ratio exceeds 2.5, the rate of dissolution in an alkaline developer may become too high and the adhesion of the pattern to a substrate lower.

The compound of formula (1) should preferably have a weight average molecular weight (Mw) of about 200 to 2,500 and more preferably about 300 to 2,000. With a Mw of less than 200, the resist film may become less resistant to heat. A Mw in excess of 2,500 can become one cause of the scum.

Examples of the compound include methylene bisphenol, 4,4',4"-methylidene trisphenol, 1,1-bis(3,5-dimethyl-4-hydroxyphenyl)-1-[4-{1-(4-hydroxyphenyl)-1-methylethyl}phenyl]ethane, 2,6-bis[(2-hydroxy-5-methyl-phenyl)methyl]-4-methylphenol, 4,4'-[(4-hydroxyphenyl)-methylene]bis(2,6-dimethylphenol), and 2,4,6-tris(4-hydroxyphenylmethyl)-1,3-benzene diol.

According to the invention, the compound of formula (1) in which the phenolic hydroxyl group is partially acylated is used as the dissolution accelerator. The percent acylation is preferably 10 to 95 mol %, more preferably 10 to 50 mol %, and most preferably 10 to 30 mol % of the compound of formula (1). With a percent acylation of less than 10 mol %, the compound may not fully exert its substrate adhesion-improving effect. With a percent acylation of more than 95 mol %, the rate of dissolution in an alkaline developer may become low and the formation of a lift-off pattern become difficult.

Understandably, acylation of phenolic hydroxyl groups can be effected by conventional methods.

In the practice of the invention, the dissolution accelerator is preferably blended in an amount of about 1 to 60 parts, more preferably about 2 to 40 parts by weight per 100 parts by weight of the resin component. Less amounts of the dissolution accelerator may not fully exert the development of undercuts. With too large amounts, the effect of preventing unexposed areas from being dissolved in an alkaline developer becomes insufficient so that the pattern may be dissolved away.

The organic solvent in which the above components are dissolved may be selected from well-known ones, for example, ethyl cellosolve acetate, ethylene glycol monoalkyl ethers and acetates thereof, propylene glycol monoalkyl ethers and acetates thereof, diethylene glycol mono- or dialkyl ethers, alkyl lactates, alkyl alkoxypropionates, ketones such as methyl ethyl ketone, methyl isobutyl ketone, and cyclohexanone, and acetates such as butyl acetate. These solvents may be used alone or in admixture of two or more.

In the resist composition of the invention, there may be formulated any of additives such as surfactants commonly used in conventional single layer lift-off photoresist compositions.

Any conventional method can be used when a resist pattern for the lift-off procedure is formed using the composition of the invention.

EXAMPLE

Synthesis Examples and Examples are given below together with Comparative Examples for illustrating the invention, but are not construed as limiting the scope of the invention thereto. All parts are by weight.

Synthesis Example 1

In 660 parts of acetone were dissolved 100 parts of 1,1-bis(3,5-dimethyl-4-hydroxyphenyl)-1-[4-{1-(4-hydroxyphenyl)-1-methylethyl}phenyl]ethane and 33 parts of benzoyl chloride. Triethylamine, 25 parts, was added dropwise to the solution, which was stirred for one hour. At the end of reaction, the reaction solution was poured into 13,000 parts of 0.1N aqueous hydrochloric acid. The resulting precipitate was collected, dissolved in 500 parts of ethyl acetate, and washed three times with 300 parts of pure water. The solvent was distilled off in vacuum, yielding a dissolution accelerator of the following formula.

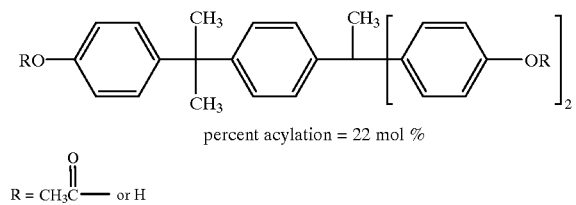

percent acylation = 22 mol %

$R = CH_3\overset{O}{\underset{\|}{C}}-$ or H

Example 1

In ethyl cellosolve acetate were dissolved 100 parts of a novolac resin having an average molecular weight Mw of 8,600, 43 parts of a quinonediazido compound in which 66 mol % of 2,3,4-trihydroxybenzophenone is esterified with o-naphthoquinonediazido-5-sulfonic acid, and 34 parts of the dissolution accelerator obtained in Synthesis Example 1. A fluorochemical surfactant Florinate FC430 (Sumitomo-3M Co., Ltd.) was added in an amount of 0.1% by weight based on the weight of the solvent. The solution was passed through a 0.5-micron membrane filter, obtaining a resist solution. The resist solution was then applied onto a mirror-finished silicon wafer by means of a spin coater, and dried on a hot plate at 90° C. for 90 seconds, forming a resist film of 0.8 micron thick. Using a reduction projection aligner (i-line, NA=0.5), the resist film was then exposed to light through a reticle having a 1:1 line-and-space pattern. The resist-bearing wafer was heated on a hot plate at 110° C. for 90 seconds and statically developed with a 2.4 wt % tetramethylammonium aqueous solution. The resist pattern was formed even to a 1.0-micron line-and-space pattern, without peeling.

Comparative Example 1

A resist solution was prepared as in Example 1 except that 1,1-bis(3,5-dimethyl-4-hydroxyphenyl)-1-[4-{1-(4-hydroxyphenyl)-1-methylethyl}phenyl]ethane having not undergone hydroxyl group-blocking treatment was used as the dissolution accelerator. A resist pattern was similarly formed. The minimum pattern line width that could be formed corresponded to a 2.0-micron line-and-space pattern. In areas exposed through masks of 1.5 microns or less, peeling occurred more or less and the pattern formation was not sufficient.

Comparative Example 2

A resist solution was prepared as in Example 1 except that 2,6-bis[(2-hydroxy-5-methylphenyl)methyl]-4-methylphenol having not undergone hydroxyl group-blocking treatment was used as the dissolution accelerator. A resist pattern was similarly formed. The minimum pattern line width that could be formed corresponded to a 3.0-micron line-and-space pattern. In areas exposed through masks of 2 microns or less, peeling occurred more or less and the pattern formation was not sufficient.

There has been described a single layer lift-off resist composition which is improved in adhesion to a substrate over prior art compositions.

Japanese Patent Application No. 2000-045446 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A single layer lift-off resist composition comprising 100 parts by weight of a novolac resin, 25 to 45 parts by weight of a quinonediazidosulfonate photosensitive agent, and 34 to 60 parts by weight of an aromatic hydroxy compound having at least one phenolic hydroxyl group in which the phenolic hydroxyl group is partially acylated, represented by the following general formula (1):

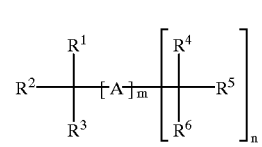

(1)

wherein m is an integer of 0 to 2, n is an integer of 0 to 2, with the proviso that m is 1 or 2 when n is 0;

$R^1$ to $R^6$ are independently hydrogen, methyl, a group of the following formula (2), or a group of the following formula (3);

when n is 0 and m is 1, A is hydrogen, methyl or a group of the following formula (2);

when n is 0 and m is 2, one of A is methylene or a group of the following formula (4), and the other of A is hydrogen, methyl or a group of the following formula (2);

when n is 1, A is methylene or a group of the following formula (4);

when n is 2 and m is 1, A is methine or a group of the following formula (5); and when n is 2 and m is 2, one of A is methylene or a group of the following formula (4), and the other of A is methine or a group of the following formula (5), with the proviso that at least one of $R^1$ to $R^6$ and A has a structure of a benzene ring having a hydroxyl group added thereto,

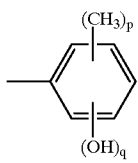
(2)

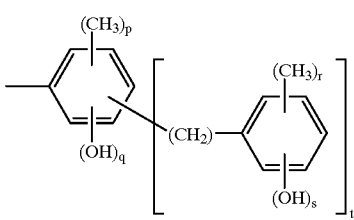
(3)

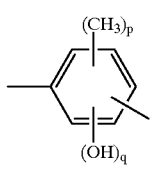
(4)

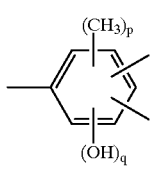
(5)

wherein p, q, r and s are integers of 0 to 3, and t is an integer of 1 to 3.

2. The composition of claim 1 wherein the number of benzene rings contained in the compound of formula (1) is 2 to 20.

3. The composition of claim 1 wherein in the compound of formula (1), the ratio of the number of phenolic hydroxyl groups to the number of benzene rings is from 0.5 to 2.5.

4. The composition of claim 1 wherein the compound of formula (1) has a weight average molecular weight of 200 to 2,500.

5. A composition of claim 1, wherein the resin has a weight average molecular weight of about 2,000 to 20,000.

6. A composition of claim 1, wherein the composition comprises 30 to 40 parts by weight of a photosensitive agent.

7. A composition of claim 1, wherein the number of benzene rings in the compound of formula (1) is 2 to 20.

8. A composition of claim 1, wherein the number of benzene rings in the compound of formula (1) is 3 to 10.

9. A composition of claim 1, wherein in the compound of formula (1), the ratio of the number of phenolic hydroxyl groups to the number of benzene rings is from 0.7 to 2.0.

10. A composition of claim 1, wherein the compound of formula (1) has a weight average molecular weight of 300 to 2,000.

11. A composition of claim 1, wherein the percent acylation of a compound of formula (1) is 10 to 95 mol %.

12. A composition of claim 1, wherein the percent acylation of a compound of formula (1) is 10 to 50 mol %.

13. A composition of claim 1, wherein the percent acylation of a compound of formula (1) is 10 to 30 mol %.

14. A composition of claim 1, wherein the composition comprises 34 to 40 parts by weight of a compound of formula (1).

15. A composition of claim 1, further comprising a surfactant.

16. A composition of claim 1, which is positive-acting.

17. A composition of claim 1, wherein the resin has a weight average molecular weight of about 5,000 to 15,000.

18. A composition of claim 1 dissolved in an organic solvent.

19. A resist pattern comprising a composition according to claim 1.

* * * * *